United States Patent [19]

Patil

[11] Patent Number: 4,595,880
[45] Date of Patent: Jun. 17, 1986

[54] BATTERY STATE OF CHARGE GAUGE

[75] Inventor: Prabhakar B. Patil, Detroit, Mich.

[73] Assignee: Ford Motor Company, Dearborn, Mich.

[21] Appl. No.: 520,967

[22] Filed: Aug. 8, 1983

[51] Int. Cl.$^4$ ............................................. G01N 27/46
[52] U.S. Cl. .................................... 324/427; 324/431; 324/434; 364/483
[58] Field of Search ............... 324/427, 428, 430, 431, 324/433, 434; 340/636; 320/48; 364/483

[56] References Cited

U.S. PATENT DOCUMENTS

| | | | |
|---|---|---|---|
| 3,886,442 | 5/1975 | Chiku et al. | 324/427 |
| 4,289,836 | 9/1981 | Lemelson | 429/61 |
| 4,390,841 | 6/1983 | Martin et al. | 324/427 |
| 4,460,870 | 7/1984 | Finger | 324/431 |
| 4,484,140 | 11/1984 | Dieu | 324/434 |

Primary Examiner—Reinhard J. Eisenzopf
Assistant Examiner—Kevin D. O'Shea
Attorney, Agent, or Firm—Peter Abolins; Keith L. Zerschling

[57] ABSTRACT

A method of computing the state of charge for a battery including the steps of sensing the battery voltage and current, and computing the used battery capacity, $C_u$, and the average battery current, $\bar{I}$. The total battery capacity, $C_t$ is calculated from average current using the Peukert equation. The state of charge is calculated as a function of $C_u/C_t$ to account for temperature and aging effects, recuperation effects, regeneration effects, and current variation effects.

5 Claims, 5 Drawing Figures

BATTERY STATE OF CHARGE GAUGE

BACKGROUND OF THE INVENTION

1. Field of the Invention

This invention relates to determining the electrical condition of a battery.

2. Prior Art

Various apparatus using analog circuits are known to determine the state of charge of the battery. However, known meters have reduced accuracy because they do not take into account some significant parameters which affect the state of charge.

U.S. Pat. No. 3,886,442 issued to Chiku et al teaches a state of charge indicator circuit which employs the Peukert Equation in order to provide a measurement of the actual state of charge. The Peukert Equation relates the known fully charged battery capacity and the discharging battery current and is used to determine a compensated current related to the discharge current. An ampere-hour parameter corresponding to a known fully charged battery capacity is stored. An actual state-of-charge of the battery is determined by detecting the difference between an ampere-hour parameter integrated from the compensated current and the stored ampere-hour parameter. The patent discloses analog circuitry which does not take into account the discharge history of the battery, the recuperation effect of the battery, the regeneration efficiency of the battery and age compensation.

U.S. Pat. No. 4,289,836 issued to Lemelson teaches a battery recharging system including a microprocessor which receives as inputs battery voltage, current and temperature signals. The flow of electrical energy to recharge the battery is controlled in response to various battery conditions.

Accurate indication of the amount of charge remaining in the battery is particularly desirable in electric vehicle traction batteries. The available charge is directly related to the range available from the vehicle before a recharge. Because of the limited range of the electric vehicle and also because recharging facilities are not available on the road, an accurate fuel gauge is particularly desirable.

Also, known prior art coulomb meters for measuring the state of charge have inaccuracies because they do not take into account such variable factors as current variation, temperature, aging, recuperation and regeneration. These are some of the problems this invention overcomes.

SUMMARY OF THE INVENTION

A state of charge meter in accordance with an embodiment of this invention takes into account the effects of current variation, temperature, aging, recuperation and regeneration.

A microprocessor method is used to produce a very accurate state of charge indication. Inputs to the microprocessor include battery voltage, battery current and temperature signals from sensors. The microprocessor samples the voltage and current signals several times a second and after averaging the signals, calculates the used battery capacity, $C_u$, and the average battery current $\bar{I}$. The total battery capacity, $C_t$, is then calculated from the average current by using the Peukert equation. The Peukert constants are determined experimentally for each battery and varied as a function of temperature and age. Then, the state of charge is calculated as a function of $C_u/C_t$, which calculation automatically accounts for temperature and aging effects, recuperation effects, regeneration effects, and current variation effects. The state-of-charge provides an indication of the remaining useful capacity of the battery.

Advantageously, the derivative of battery voltage with respect to used battery capacity, $dV/dC_u$ is also computed and compared to a predetermined maximum. If the maximum is exceeded, at least one cell of the battery has an undesirably large dynamic resistance. Such a large dynamic resistance can indicate an inoperative battery cell or a low state-of-charge. In either case, further use of such a battery may cause battery damage.

DETAILED DESCRIPTION OF THE INVENTION

Figure 1:
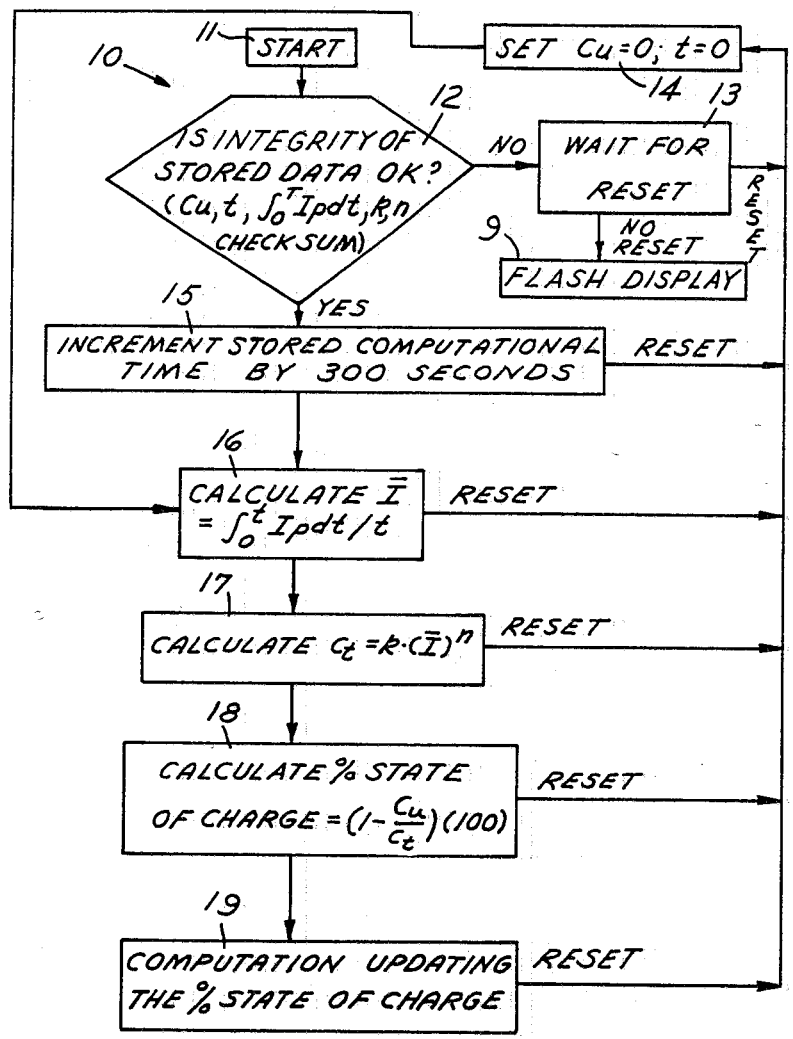
FIG. 1 is a logic flow diagram of the basic components of the method of computing state-of-charge of a battery in accordance with an embodiment of this invention.
Figure 2A:
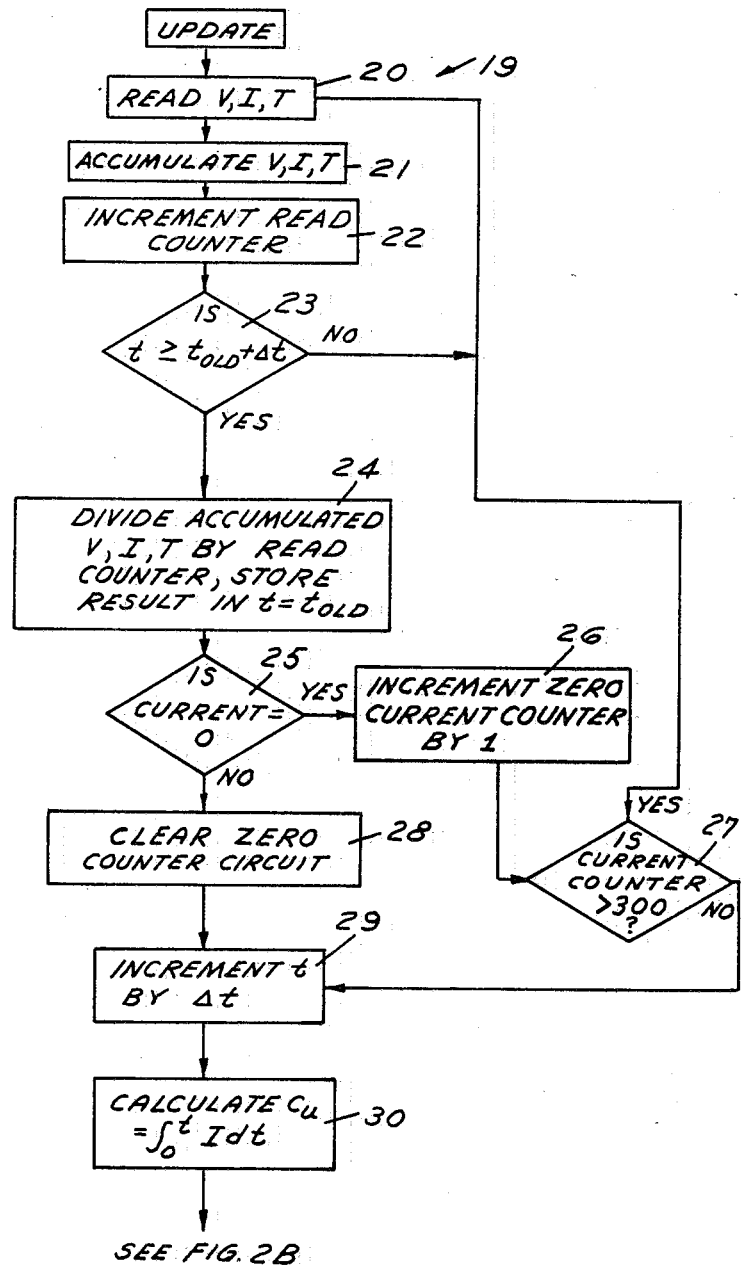
FIGS. 2A and 2B are logic flow diagrams of the last block of FIG. 1 wherein there is a computation updating the percent state of charge.
Figure 2B:
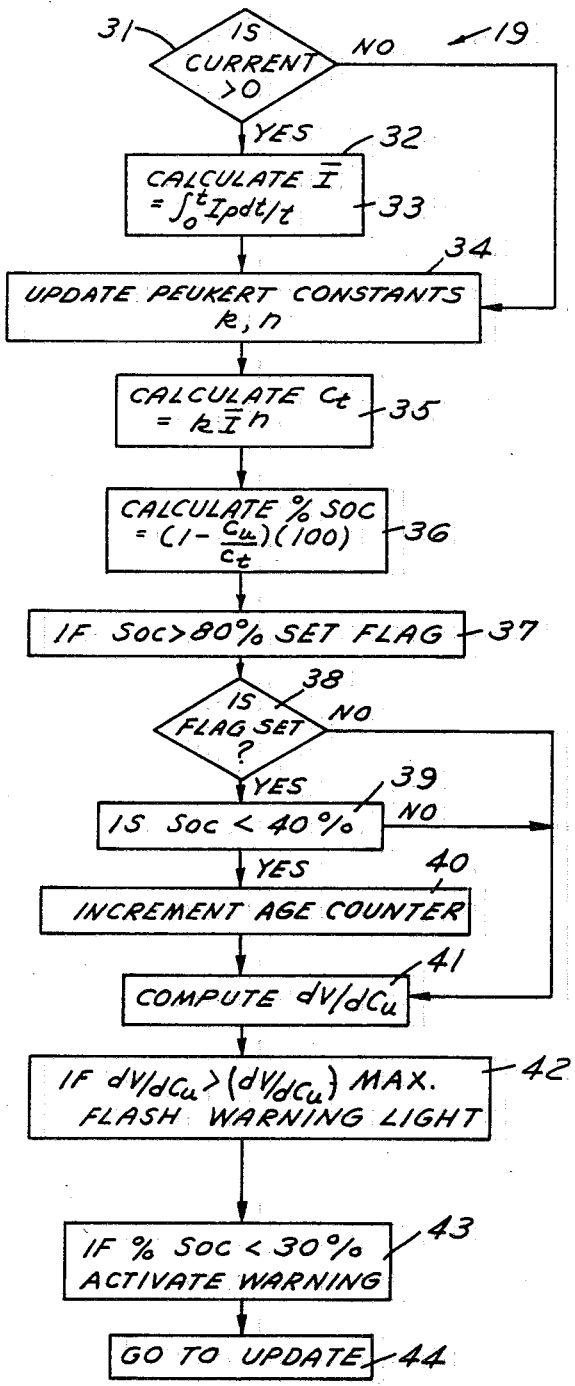

Referring to FIG. 1, the initial steps for a computation of the state of charge are shown. Block 19 indicates an update computation of the percent state of charge. FIGS. 2A and 2B show a more detailed block diagram of the update computation for the percent state of charge.

The computation of FIG. 1 starts at block 11 by proceeding to a block 12 which checks the integrity of stored data. The stored data includes the used battery capacity ($C_u$), elapsed time (t) since computation began, the integral of positive battery current, Ip, with respect to time, Peukert equation constants (k, n), and a check sum for error detection. The check sum is a stored indication of the originally stored numbers. If the computed check sum of the retrieved stored information is not equal to the stored check sum there is an error. In this case, the logic flow proceeds to block 13 where the program waits for a reset at which time it goes to block 14. If there is no reset, block 9 causes a display to flash to indicate operator action is required.

In block 14, the used capacity $C_u$ is set to zero, the time is set to zero and the program proceeds to block 16. If the stored data is established to have integrity, the logic proceeds to block 15. The stored computation time is then incremented by a fixed amount, such as by 300 seconds. This incrementation is made to indicate the assumption that the battery has been at rest long enough so that there has been recuperation. Recuperation is a phenomenon wherein the battery regains a part of its charge after discharge ceases without the application of a regenerating current. In contrast, regeneration occurs when a charging current is applied to the battery. In block 16, an average current is computed from the integral from zero to t of the positive battery current with respect to time. Next, in block 17, the total capacity $C_t$ is calculated using the Peukert equation, $C_t = K \cdot \bar{I}^n$. In block 18, the percent of the state of charge, SOC, is calculated using a formula:

$$\left(1 - \frac{C_u}{C_t}\right) \cdot (100)$$

In block 19, there is performed a computation updating the percent of the state of charge.

If a reset occurs during the sequence shown in FIG. 1, then the program reinitializes by returning to block 14 to set $C_u$ to zero and t equal to zero. The reset is indicated by arrows going to the right from blocks 13, 15, 16, 17, 18 and 19.

Referring to FIGS. 2A and 2B, there is shown a more detailed logic flow of the computation updating the percent of the state of charge. In other words, the flow from block 18 of FIG. 1 would be to block 20 of FIG. 2A wherein the voltage (V), current (I), and temperature (T) are read. In block 21, the read values of V, I and T are added or accumulated to previously read values of V, I and T stored in a memory. In block 22, a read counter is incremented to indicate another data reading. The number in the read counter indicates the number of times that the combination of the voltage, current and temperature information has been read.

At block 23, the current time, t, is compared to the sum of a time, $t_{old}$, at which an average of battery current had been previously computed, and a desired time increment, delta t, at the end of which the state of charge computation is updated. If delta t is too small, the computed averages for the battery current may be undesirably affected by transient values for the measured voltage, current and temperature. On the other hand, if the value for delta t is too large, the computational updating of the computed average battery current may occur so infrequently as to be inaccurate. A typical value for delta t is about one second. If the delta t period has not passed, the logic flow returns to block 20 to read voltage, current and temperature again. If the delta t time period has passed, the logic flow proceeds to block 24.

In block 24, the accumulated values of voltage, current and temperature are divided by the read counter to get the average of the readings. This result is stored. The time $t_{old}$ is updated and set equal to the current time t. From block 24 the logic goes to a decision at block 25 wherein the battery current is examined to determine whether or not it is zero. This examination is done to determine whether the battery is in an idle state, i.e. no regeneration or discharging. During this period, the phenomenon known as recuperation occurs. If the battery current is zero, the logic method proceeds to a block 26 wherein a zero current counter is incremented by one. That is, the information in the zero current counter indicates how many seconds the current to the battery has been zero. The output of block 26 is applied to block 27 to determine if the current counter is greater than 300 seconds. Three hundred seconds is considered to be about the maximum time during which effective recuperation can take place. If the current counter is greater than 300 seconds, the logic flow returns to block 20.

Returning to block 25, if the current is not zero, the method proceeds to a block 28 where the zero current counter circuit is cleared. Then the program moves to a block 29 wherein time, t, is incremented by delta t. Also, if the zero current counter is not greater than 300, as determined in block 27, the program moves to block 29 and then to a block 30. At block 30, the used battery capacity, $C_u$, is calculated using the integral of the battery current between zero and time t. From block 30, the logic goes to block 31 (FIG. 2B) wherein there is a determination if the current is greater than zero. If it is, the average current is calculated using the integral of the positive current from zero to t with respect to time divided by the time. At block 34, the Peukert constants k and n are updated. If the current was not greater than zero in block 31, the logic proceeds directly to block 34 and then to block 35. At block 35, the total battery capacity is calculated using $C_t$ equal to k times the average current to the nth power. At block 36 the percent of the state of charge is calculated by multiplying the quantity $(1 - C_u/C_t)$ by 100.

At block 37, the state of charge is checked to see if it is greater than eighty percent and, if so, a flag is set, i.e. this information is stored in memory. This sequence then goes to block 38 where it is inquired if a flag is set. If yes, a determination is made in block 39 if the state of charge is less than forty percent. If yes, an age counter is incremented at block 40. At block 41, the change of the battery voltage with respect to the change in used battery capacity is computed. If the flag was not set in block 38, the logic program proceeds directly to block 41. Similarly, if the state of charge was not less than 40% in block 39, the logic program proceeds directly to block 41.

In block 42, the derivative of the voltage with respect to the used battery capacity is checked to see if it is greater than a permissible maximum value. If it is, a warning light is flashed indicating that the dynamic resistance of at least one cell in the battery has significantly increased thereby indicating a cell problem. Such an increase in the dynamic resistance of one battery cell can occur even when numerous other cells of the same battery still have a relatively high state of charge. On the other hand, a low state of charge for all modules can also cause an increase in the magnitude of $dV/dC_u$. Typically, it is desirable to determine the cause of the increased magnitude of $dV/dC_u$ before continuing use of the battery. In block 43, the percent of the state of charge is checked to see if it is less than thirty percent and a warning is activated if it is. In block 44, there is an instruction to return to the beginning of the loop within major block 19.

The checking of the state of charge with respect to eighty percent and forty percent and the sequence between blocks 37 and 40 is done to determine if a complete state-of-charge cycle has occurred. The occurrence of such a cycle, that is, an excursion between eighty and forty percent of the maximum state of charge is used to update the age of the battery. The age of the latter is, in turn, used to update the parameters of the Peukert equation. The computation process shown in FIGS. 2A and 2B runs continuously until interrupted by a cutoff of power or by a reset command from the operator. If power is taken away, the magnitudes of the various variables are stored in a keep-alive memory powered by a small battery. In the case of a reset, all the variables are reset to initial values and a computation procedure restarted.

Summarizing the preceding logic flow, signals from voltage and current sensors is coupled to a battery to be tested or sampled many times a second, typically, 100.

These are averaged to eliminate the effects of chopping wave forms used in electric vehicles. The current and voltage signals are used to compute the derivative of the battery voltage with respect to used battery capacity current. If this derivative is larger than a preset value, a warning signal is activated to indicate battery problems such as a shorted cell. Although such a warning would occur when the battery has a low state of charge, it may also occur when one cell of a battery has a high dynamic resistance. Such an increase in dynamic resistance can be due to electrical or physical failure of one cell. Even though it may not be desirable to use a battery with a reltively high $dV/dC_u$, it is desirable to determine if an adequate state of charge of the battery exists, even when there is a relatively high $dV/dC_u$.

To this end, the signal representing current, I, is digitally integrated with respect to time, t, every second to compute the used capacity, $C_u$:

$$C_u = \int_0^+ I \cdot dt \qquad (1)$$

An average current, $\bar{I}$, is computed:

$$\bar{I} = \int_0^+ I_p \cdot dt/t \qquad (2)$$

Note that in equation 2 only positive or discharge values of currents, $I_p$, are used. That is, I is set to zero if current is negative or charging. In contrast, the true value of current, I, is used in equation 1. The average current value is used to calculate the total battery capacity $C_t$ using the Peukert equation:

$$C_t = k \cdot (\bar{I})^n \qquad (3)$$

where k and n are Peukert constants determined experimentally for each battery and varied as a function of battery temperature and age.

The state of charge, SOC, is then calculated by:

$$SOC = \left(1 - \frac{C_u}{C_t}\right) \times 100\% \qquad (4)$$

As a result, this technique accounts for (1) temperature and aging effects through k and n in equation 3, (2) recuperation effects (when current being drawn is zero) through equation 2, (3) regeneration effects (when current is negative), through equations 1 and 2, and (4) current variation effects through the averaging process of equations 2 and 3.

Figure 3:
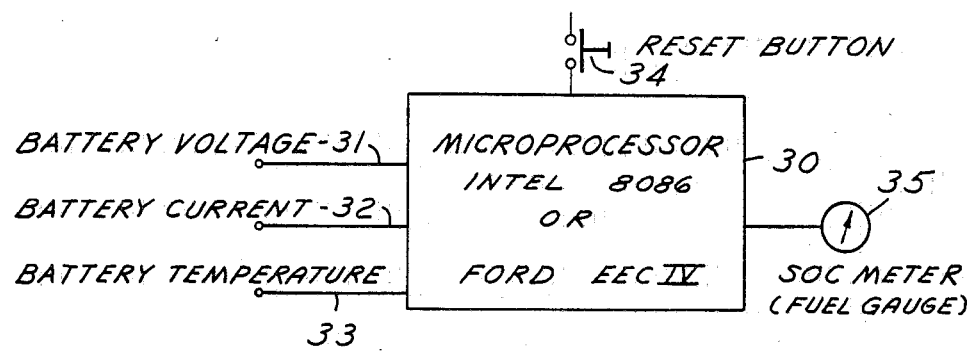
FIG. 3 is a functional block diagram of a state of charge apparatus in accordance with an embodiment of this invention.

Referring to FIG. 3, a block diagram includes a microprocessor block 30 having inputs of battery voltage 31, battery current 32 and battery temperature 33. Also applied to the microprocessor is a reset button 34. An output from the microprocessor is a state of charge meter or fuel gauge 35. The apparatus of FIG. 3 can carry out the method described in FIGS. 1, 2A and 2B.

Figure 4:
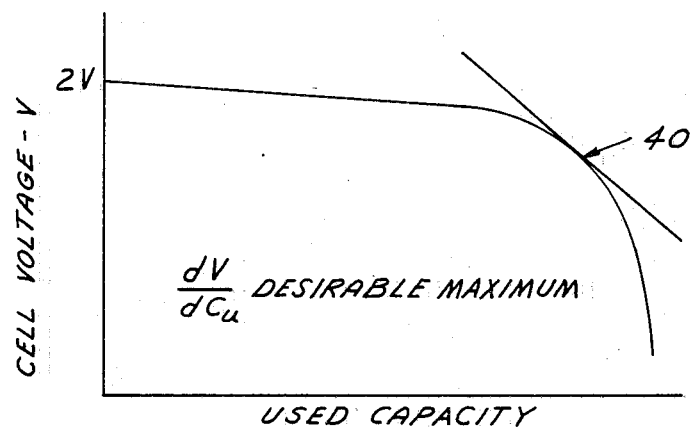
FIG. 4 is a graph of cell voltage versus used cell capacity indicating the point at which the cell has reached the end of usable cell capacity.

Referring to FIG. 4, the cell voltage decreases slowly, then rapidly with increasing used battery capacity. The slope of the curve corresponds to the combined effective dynamic resistance of all the cells in series. The contribution to this slope by an individual cell undergoes a rapid increase as the cell reaches the end of its usable capacity and can be detected by continuously calculating the slope for the entire battery pack. One or more cells can reach the end of their usable capacity even when the battery pack itself indicates a high state of charge. It is important to detect this occurrence since discharging the battery further after some cells have reached the end of their useful capacity is detrimental to the cells. The end of usable cell capacity is indicated by a point 40.

Various modifications and variations will no doubt occur to those skilled in the art to which this invention pertains. For example, a particular sequence of the steps may be varied from that disclosed herein. These and all other variations which basically rely on the teachings through which this disclosure has advanced the art are properly considered within the scope of this invention.

I claim:

1. A method for computing the state of charge for a battery including the steps of:

measuring $I_p$, wherein Ip is the battery discharge current;

determining $\bar{I}$, wherein $\bar{I}$ is the average battery current, by calculating $$\left(\int_0^t I_p dt\right)/t;$$

empirically determining k and n for the battery, wherein k and n are Puekert constants;

calculating the total capacity, $C_t$, of the battery using the Puekert equation, $C_t = k \cdot \bar{I}^n$;

reevaluating k, n as a function of temperature and age of the battery;

calculating the used battery capacity, $C_u$, by integrating battery current with respect to time;

calculating the percent state of charge using $(1 - C_u/C_t)(100)$, and repeating the above steps to determine the state of charge the battery at subsequent times.

2. A method as recited in claim 1 further comprising the steps of determining if the battery has gone through a charging-discharging cycle of between about eighty percent and forty percent of the maximum state of charge.

3. A method as recited in claim 2 wherein successive readings of battery current and temperature are made about 100 times per second and an average of the readings is taken about every second.

4. A method as recited in claim 3 wherein the effects of recuperation are taken into effect by detecting the occurrence of a zero battery current of about 300 seconds at which time recuperation is substantially completed.

5. A method for detecting in a battery an abnormal battery cell condition including the steps of:

measuring the battery voltage V, and current, I,;

calculating the used battery capacity, $C_u$, by integrating battery current with respect to time;

determining the partial derivative of battery voltage, V, with respect to used battery capacity, $C_u$;

comparing $dV/dC_u$ to a predetermined value; and determining a battery cell has an undesirably high dynamic resistance if $dV/dC_u$ is greater than the predetermined value.

* * * * *

UNITED STATES PATENT AND TRADEMARK OFFICE
CERTIFICATE OF CORRECTION

PATENT NO.    : 4,595,880
DATED         : June 17, 1986
INVENTOR(S)   : Prabhakar B. Patil It is certified that error appears in the above-identified patent and that said Letters Patent is hereby corrected as shown below:

Col. 6, lines 25-29, should read $$\left[ \int_0^t I_p dt \right] / t;$$

Signed and Sealed this

Twentieth Day of April, 1993

Attest:

MICHAEL K. KIRK

*Attesting Officer*     *Acting Commissioner of Patents and Trademarks*